United States Patent
Huang et al.

(10) Patent No.: US 7,836,422 B1
(45) Date of Patent: Nov. 16, 2010

(54) SYSTEM, METHOD AND APPARATUS FOR OPTIMIZING MULTIPLE WIRE PITCHES IN INTEGRATED CIRCUIT DESIGN

(75) Inventors: Dajen Huang, Santa Clara, CA (US); Yi Wu, Santa Clara, CA (US)

(73) Assignee: Oracle America, Inc., Redwood City, CA (US)

( * ) Notice: Subject to any disclaimer, the term of this patent is extended or adjusted under 35 U.S.C. 154(b) by 366 days.

(21) Appl. No.: 12/121,514

(22) Filed: May 15, 2008

(51) Int. Cl.
*G06F 17/50* (2006.01)

(52) U.S. Cl. .............. 716/13; 716/12; 716/14; 257/207

(58) Field of Classification Search ............. 716/12–14; 257/207
See application file for complete search history.

(56) References Cited

U.S. PATENT DOCUMENTS

| | | | | |
|---|---|---|---|---|
| 4,636,965 A | * | 1/1987 | Smith et al. ................... | 716/12 |
| 5,536,955 A | * | 7/1996 | Ali .............................. | 257/204 |
| 5,920,486 A | * | 7/1999 | Beahm et al. ................. | 716/10 |
| 6,467,074 B1 | * | 10/2002 | Katsioulas et al. ............ | 716/17 |
| 6,510,539 B1 | * | 1/2003 | Deemie et al. ................. | 716/2 |
| 6,938,226 B2 | * | 8/2005 | Nguyen et al. ................. | 716/1 |
| 7,487,488 B1 | * | 2/2009 | Huang et al. .................. | 716/14 |
| 2004/0153985 A1 | * | 8/2004 | Paul et al. ...................... | 716/10 |
| 2006/0095872 A1 | * | 5/2006 | McElvain et al. .............. | 716/1 |
| 2009/0026502 A1 | * | 1/2009 | Wu et al. ..................... | 257/207 |

* cited by examiner

*Primary Examiner*—Naum B Levin
(74) *Attorney, Agent, or Firm*—Martine Penilla & Gencarella, LLP (57) ABSTRACT

A method for routing wires in an integrated circuit includes defining an even number n of initial width routing tracks in a selected routing channel. The n initial routing tracks are separated by a substantially equal first separation distance from the other routing tracks, Vss and Vdd in the routing channel. The n initial width routing tracks and the first separation distance have an initial width about equal to the minimum design width. An odd number of routing tracks less than n are then selected, the odd number of routing tracks have a second pitch greater than the first pitch, assigning the odd number of routing tracks in the routing channel. A third routing pitch can be defined that is wider than the second routing pitch for alternating routing tracks at the odd number of routing tracks if needed. A wire routing system in an integrated circuit is also described.

19 Claims, 6 Drawing Sheets

SYSTEM, METHOD AND APPARATUS FOR OPTIMIZING MULTIPLE WIRE PITCHES IN INTEGRATED CIRCUIT DESIGN

BACKGROUND

The present invention relates generally to design and manufacture of integrated circuits, and more particularly, to systems, methods and apparatus for routing wires on a layer in an integrated circuit.

Integrated circuit designs often include more than one routing wire pitch including different wire widths and/or different spacing between the wires of same or different widths. The different routing wire pitches are often used to satisfy the often conflicting goals of current load, timing (i.e., data transmission speed) and area of the die consumed. A wider wire pitch including either wider spaces between the wires and/or wider wire width, typically provides faster transmission speed. Therefore a wider wire pitch is typically used for timing critical signal paths to satisfy timing goals.

A narrower wire pitch includes either closer spaced wires and/or narrower wire width. Narrower wire pitches typically provide a slower transmission speed and is therefore used for signal paths that are not timing critical. Narrower wire pitches are typically compressed as close as design constraints allow to reduce the overall die size of the resulting integrated circuit.

The wires are routed across the semiconductor die in specified routes commonly referred to as a routing channel. Unfortunately, the typical approach to combining wider pitch wires and narrower pitch wires in a common routing channel typically results in an inefficient use of the available space in the routing channel and can result in increasing the overall size of the die.

In view of the foregoing, there is a need for more efficiently routing wires having more than one pitch in a common routing channel

SUMMARY

Broadly speaking, the present invention fills these needs by providing an improved system and method for routing wires in an integrated circuit design. It should be appreciated that the present invention can be implemented in numerous ways, including as a process, an apparatus, a system, computer readable media, or a device. Several inventive embodiments of the present invention are described below.

One embodiment provides a method for routing wires in an integrated circuit design. The method includes selecting a first routing channel from a plurality of routing channels in a first conductive layer of a plurality of conductive layers of the integrated circuit. The selected routing channel includes a Vss wire on a first edge and a Vdd wire on an opposite edge. The method also includes determining a wire routing for the selected routing channel including defining an even number n of initial width routing tracks in a selected routing channel, wherein each of the n initial width routing tracks have a first pitch. The first pitch includes each of the n initial width routing tracks is separated by a substantially equal first separation distance from the other routing tracks, Vss and Vdd in the routing channel. Each of the n initial routing width tracks and the substantially equal first separation distance have an initial width about equal to the minimum design width allowed by a manufacturing process used to form the integrated circuit. The method further includes selecting an odd number of routing tracks less than n, wherein the odd number of routing tracks have a second pitch that is greater than the first pitch, assigning the odd number of routing tracks in the routing channel, analyzing a routing requirement for the routing channel and defining a third routing pitch wider than the second routing pitch for alternating routing tracks of the odd number of routing tracks when the routing channel requires a routing pitch wider than the second pitch.

The second pitch can include a wire width greater than the minimum design width allowed by a manufacturing process used to form the integrated circuit. The second pitch can include a spacing width greater than the minimum design width allowed by a manufacturing process used to form the integrated circuit.

The third pitch can include a wire width greater than the wire width of the second pitch. The third pitch can include a wire width equal to about twice the wire width of the second pitch. The third pitch can include a third spacing width greater than the second spacing width. The third pitch can include a third spacing width equal to about twice the second spacing width.

Analyzing the routing requirement for the routing channel can include determining the routing channel requires at least one routing track having the third pitch and at least one routing track having the second pitch. The at least one routing track having the third pitch and the at least one routing track having the second pitch are separated by an unused routing track having the second pitch. At least one of a plurality of performance characteristic of each of the wires in the routing tracks adjacent to the unused routing track exceeds a performance characteristic goal.

The method can further include routing an additional wire in at least a portion of the unused routing track wherein the additional wire reduces the at least one of the plurality of performance characteristic of each of the wires in the routing tracks adjacent to the unused routing track to not less than the performance characteristic goal. Analyzing the routing requirement for the routing channel can include determining at least one of a plurality of performance characteristic of each of the wires in the routing channel exceeds a performance characteristic goal and wherein defining wires having the first pitch reduces the at least one of the plurality of performance characteristic of each of the wires to not less than the performance characteristic goal.

The method can further include selecting a second routing channel from the plurality of routing channels in the first conductive layer of the integrated circuit and determining a corresponding wire routing for the selected routing channel. The method can also include selecting a second conductive layer of the integrated circuit and determining a corresponding wire routing for the second conductive layer.

Another embodiment provides a method for routing wires in an integrated circuit design selecting a first routing channel from a plurality of routing channels in a first conductive layer of a plurality of conductive layers of the integrated circuit, wherein the selected routing channel includes a Vss wire on a first edge and a Vdd wire on an opposite edge. Determining a wire routing for the selected routing channel including defining an even number n of initial width routing tracks in a selected routing channel, wherein each of the n initial width routing tracks have a first pitch, wherein the first pitch includes each of the n initial width routing tracks is separated by a substantially equal first separation distance from the other routing tracks, Vss and Vdd in the routing channel, wherein each of the n initial width routing tracks and the substantially equal first separation distance have an initial width about equal to the minimum design width allowed by a manufacturing process used to form the integrated circuit. The method further includes selecting an odd number of routing tracks less than n, wherein the odd number of routing tracks have a second pitch that is greater than the first pitch, assigning the odd number of routing tracks in the routing channel, analyzing a routing requirement for the routing channel and defining a third routing pitch wider than the second routing pitch for alternating routing tracks of the odd number of routing tracks when the routing channel requires a routing pitch wider than the second pitch and wherein analyzing the routing requirement for the routing channel includes determining the routing channel requires a plurality of routing tracks having the third pitch. The method further includes selecting a second routing channel from the plurality of routing channels in a first conductive layer, determining a second wire routing for the second routing channel wherein the second wire routing includes a plurality of routing tracks having the second pitch, selecting a third routing channel from the plurality of routing channels in a first conductive layer, determining a third wire routing for the third routing channel wherein the third wire routing includes at least one routing track having the third pitch and the at least one routing track having the second pitch are separated by an unused routing track having the second pitch, wherein at least one of a plurality of performance characteristic of each of the wires in the routing tracks adjacent to the unused routing track exceeds a performance characteristic goal and routing an additional wire in at least a portion of the unused routing track in the third routing channel wherein the additional wire reduces the at least one of the plurality of performance characteristic of each of the wires in the routing tracks adjacent to the unused routing track to not less than the performance characteristic goal.

Yet another embodiment provides a system for defining a wire routing in an integrated circuit design comprising a processor, a memory system, an input/output system, logic for selecting a first routing channel from a plurality of routing channels in a first conductive layer of a plurality of conductive layers of the integrated circuit, wherein the selected routing channel includes a Vss wire on a first edge and a Vdd wire on an opposite edge, logic for determining a wire routing for the selected routing channel including logic for defining an even number n of initial width routing tracks in a selected routing channel, wherein each of the n initial width routing tracks have a first pitch, wherein the first pitch includes each of the n initial width routing tracks is separated by a substantially equal first separation distance from the other routing tracks, Vss and Vdd in the routing channel, wherein each of the n initial width routing tracks and the substantially equal first separation distance have an initial width about equal to the minimum design width allowed by a manufacturing process used to form the integrated circuit, logic for selecting an odd number of routing tracks less than n, wherein the odd number of routing tracks have a second pitch that is greater than the first pitch, logic for assigning the odd number of routing tracks in the routing channel, logic for analyzing a routing requirement for the routing channel and logic for defining a third routing pitch wider than the second routing pitch for alternating routing tracks of the odd number of routing tracks when the routing channel requires a routing pitch wider than the second pitch The logic for analyzing the routing requirement for the routing channel can include logic for determining the routing channel requires at least one routing track having the third pitch and at least one routing track having the second pitch. The at least one routing track having the third pitch and the at least one routing track having the second pitch are separated by an unused routing track having the second pitch and wherein at least one of a plurality of performance characteristic of each of the wires in the routing tracks adjacent to the unused routing track exceeds a performance characteristic goal and further comprising logic for routing an additional wire in at least a portion of the unused routing track wherein the additional wire reduces the at least one of the plurality of performance characteristic of each of the wires in the routing tracks adjacent to the unused routing track to not less than the performance characteristic goal.

The system can also include logic for analyzing the routing requirement for the routing channel that includes logic for determining at least one of a plurality of performance characteristic of each of the wires in the routing channel exceeds a performance characteristic goal and wherein defining wires having the first pitch reduces the at least one of the plurality of performance characteristic of each of the wires to not less than the performance characteristic goal.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for a more efficient system, method and apparatus for routing wires having different pitches in a common routing channel will now be described. It will be apparent to those skilled in the art that the present invention may be practiced without some or all of the specific details set forth herein.

Figure 1:
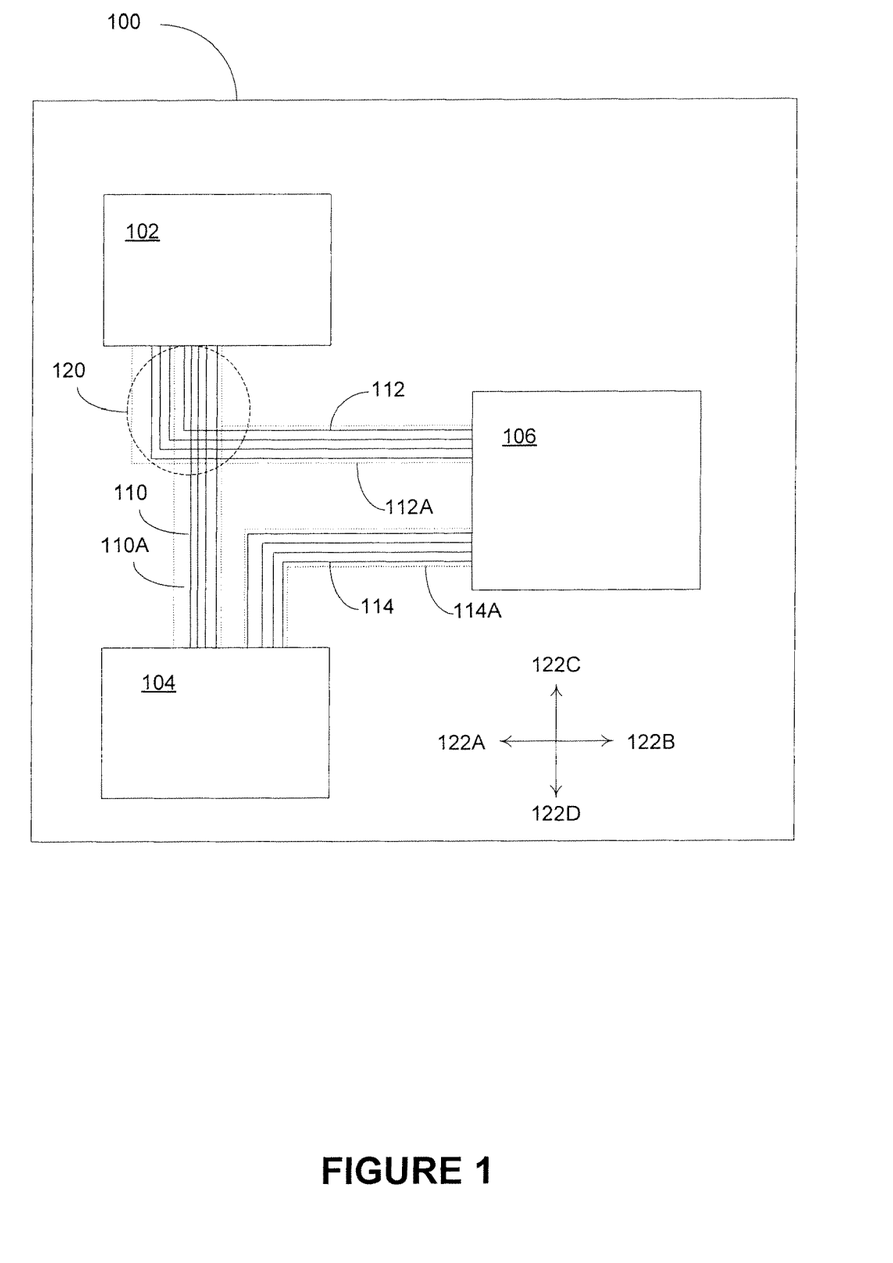
FIG. 1 is a block diagram of an integrated circuit, in accordance with an embodiment of the present invention

FIG. 1 is a block diagram of an integrated circuit 100, in accordance with an embodiment of the present invention. The integrated circuit 100 includes three logic blocks 102, 104 and 106. Multiple wires 110, 112 and 114 are routed through corresponding routing channels 110A, 112A and 114A to interconnect the logic blocks 102, 104 and 106, respectively.

This is a very simplified diagram and the routing channels 110A, 112A and 114A are shown mostly as discretely separated from one another. However in the area 120, the wires 110 and 112 cross over and even pass through the same portion of the integrated circuit 100. As a result, the area 120 can be a choke point for routing wires into the and from the logic block 102.

Figure 2:
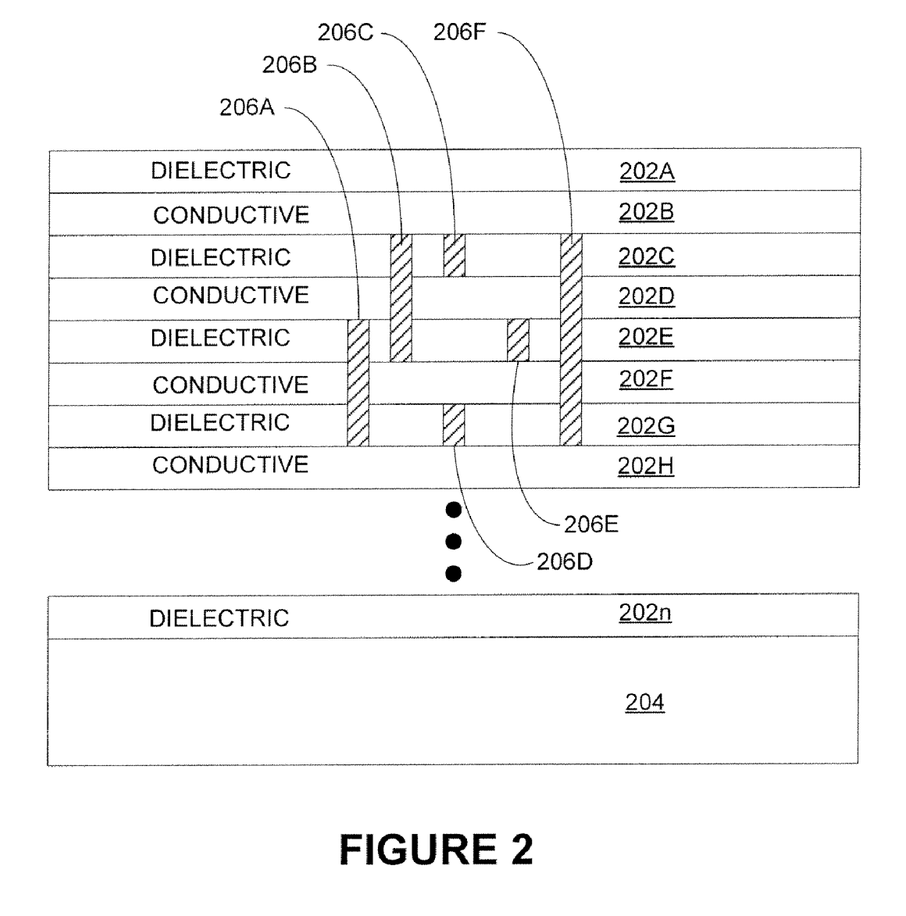
FIG. 2 is a cross-sectional view of multiple layers in the integrated circuit, in accordance with an embodiment of the present invention.

FIG. 2 is a cross-sectional view of multiple layers 202A-M in the integrated circuit 100, in accordance with an embodiment of the present invention. As shown the multiple layers 202A-M include multiple conductive layers 202B, 202D, 202F, 202H and multiple dielectric layers 202A, 202C, 202E, 202G, 202n. Typically each of the conductive layers 202B, 202D, 202F, 202H have a respective routing requirement. For example, conductive layers 202B and 202H may including routing channels directed directions 122A and 122B, as shown in FIG. 1. Similarly, conductive layers 202D and 202F may including routing channels directed in directions 122C and 122D. By way of example, wires 110 can be included in either of conductive layers 202D and/or 202F.

When a wire changes direction, the wire is routed from a first conductive layer through one or more vias 206A-206F that traverse intervening dielectric and intervening conductive layers, to a second conductive layer that provides the desired direction of travel. The vias 206A-206F may or may not be electrically connected to any intervening conductive layers 202B, 202D, 202F, 202H that the vias may cross. In a further example, wires 112 and 114 can be routed through one or more of conductive layers 202B and 202H while routing in directions 122A and 122B. When wires 112 and 114 change to direction 122C and 112D, respectively, the wires 112 and 114 traverse by way of respective vias to one or more of conductive layers 202D and/or 202F.

Figure 3A:
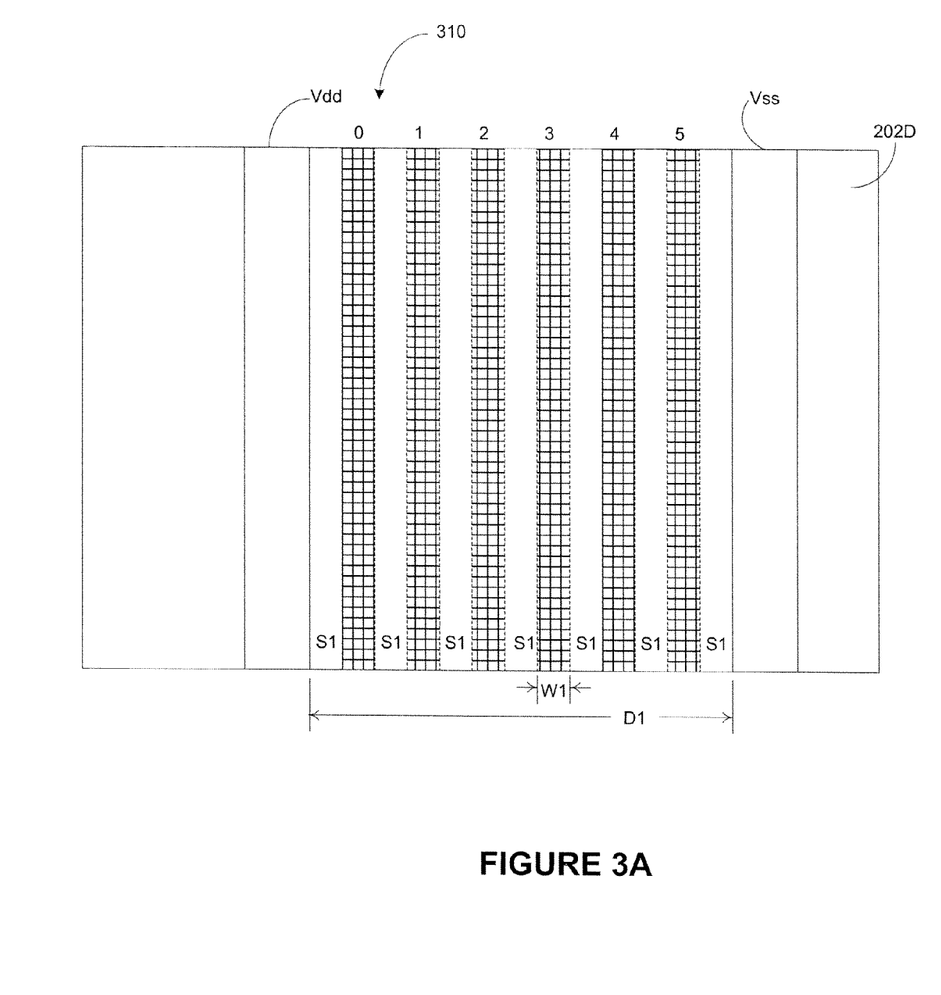
FIG. 3A is a detailed view of a portion of conductive layer in the integrated circuit, in accordance with an embodiment of the present invention.
Figure 3B:
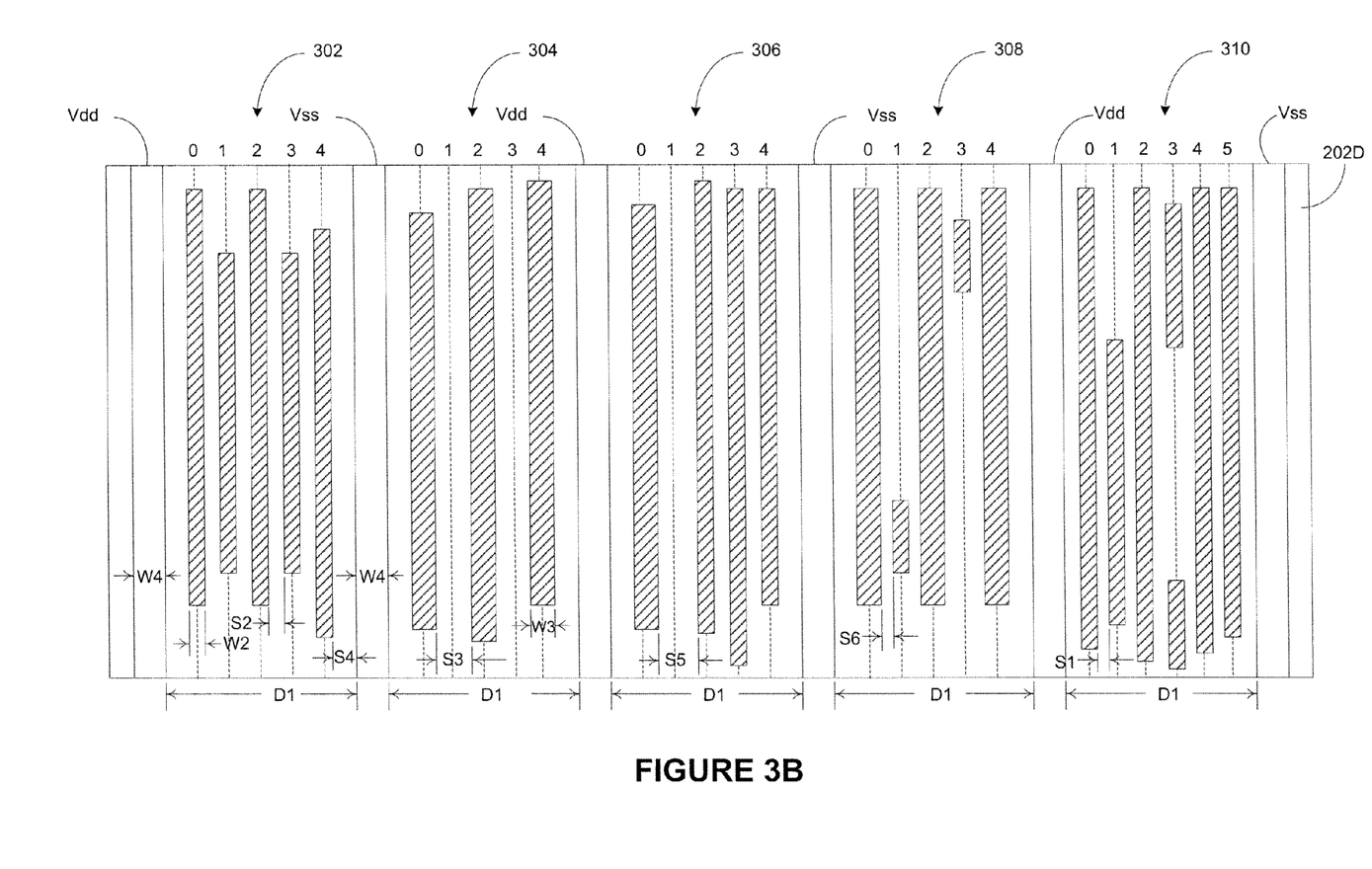
FIG. 3B shows a portion of conductive layer in the integrated circuit, in accordance with an embodiment of the present invention.

FIG. 3A is a detailed view of a portion of conductive layer 202D in the integrated circuit 100, in accordance with an embodiment of the present invention. FIG. 3B shows a portion of conductive layer 202D in the integrated circuit 100, in accordance with an embodiment of the present invention. The conductive layer 202D includes Vss and Vdd wires that define the borders of routing channels 302, 304, 306, 308 and 310. The Vss and Vdd wires are shown separated by a distance D1. The separation distance D1 defines the pitch or width of the respective routing channels 302, 304, 306, 308 and 310. It should be understood that the Vss and Vdd wires may be separated by different distances resulting in routing channels that have different pitches. While the Vss and Vdd wires are shown having a common width of W4, it should be understood that each of the Vss and Vdd wires can have a width less than equal to or greater than the W4 width.

Each of the routing channels 302, 304, 306, 308 and 310 have multiple routing tracks. The routing tracks are place holders or representations of locations that wires can be routed along within the routing channel. The routing tracks can be specifically referred to by their respective routing channel and track number. By way of example the routing track labeled "2" in routing channel 304 is referred to as routing track 304.2. Similarly the wire formed in routing track 306.3 is referred to as wire 306.3.

For exemplary purposes only, routing channels 302, 304, 306 and 308 have five routing tracks numbered 0-4. Also for exemplary purposes only, routing channel 310 includes six routing tracks numbered 0-5. It should be understood that the number of routing tracks in each routing channel is selected according to several design considerations as will be described in more detail below.

As shown in FIG. 3B, three different wire pitches of one metal layer are shown. It should be understood that while three wire pitches are shown, more or less than three wire pitches could be used. Typically two wire pitches are sufficient for a particular conductive layer as will be described in more detail below. The narrower pitch wires have a second width W2 and the wider pitch wires have a third width W3. By way of example, wire 302.0 has the second width W2 and wire 304.4 has the third width W3. The third width W3 is equal to or wider than the second width W2. In one embodiment, the third width W3 is equal to about twice the width of the second width W2. The third width W3 can also be more than about twice the width of the second width W2.

In a higher density or congested routing area additional routing tracks may be desired as shown in routing channel 310. The higher density wires 310.0-310.5 have a width W1 about equal to a minimum device width MD allowed by the manufacturing process used to form the integrated circuit. As described above, there can be additional wire widths that are not shown in FIG. 3.

The narrower pitch wires can be separated by a second separation distance S2. By way of example, wire 302.2 is separated from wires 302.1 and 302.3 by separation distance S2.

Similarly, the wider pitch wires can be separated by a third separation distance S3. By way of example, wire 304.2 is separated from wires 304.0 and 304.4 by separation distance S3. As will be described in more detail below, the separation distances S2 and S3 can be increased or reduced as required for a particular design goal. The third separation distance S3 is equal to or wider than the second separation distance S2. In one embodiment, the third separation distance S3 is about twice the width of the second separation distance S2. The third separation distance S3 can also be more than about twice the width of the second separation distance S2. In one embodiment, the third width W3 is equal to the second width W2 and the third separation distance S3 is greater than the second separation distance S2.

The higher density wires 310.0-310.5 can have a first separation distance S1 about equal to a minimum device width allowed by the manufacturing process used to form the integrated circuit so as to allow denser formation of the wires.

The wider pitch wires (e.g., wires 304.0, 304.2, 304.4, 306.0, 308.0, 308.2, and 308.4) are used for timing critical networks and circuits because the wider pitch wires will typically transfer data quicker than the narrower pitch wires (e.g., wires 302.0-302.5, 306.2-306.4, 308.1, 308.3 and 310.1-310.5). The narrower pitch wires 302.0-302.5, 306.2-306.4, 308.1, 308.3 and 310.1-310.5 are used for timing non-critical networks because they typically do not transfer data as quickly as the wider pitch wires.

Electrical capacitance is an inverse function of distance between two conductors and therefore the wider spacing of the wider pitch wires 304.0, 304.2, 304.4, 306.0, 308.0, 308.2, and 308.4 have less capacitance than the narrower spacing of the narrower pitch wires. The wider width of the wider pitch wires 304.0, 304.2, 304.4, 306.0, 308.0, 308.2, and 308.4 allow the wider pitch wires to handle more current than the narrower spacing of the narrower pitch wires. Allocating more of the pitch to spacing rather than width of the wire can improve the performance of the wires, especially in higher metal layers because higher metal layers then to be more limited by capacitance than resistance. Using multiple wire pitches in an IC design is more than defining their width and spacing to meet timing. The result of suboptimal wire tracks will be a difficult route and a larger die. By carefully designing the narrow and wider wire pitches as an example and using understand how the wires interact, and how to do routing track stealing, when is possible, will simplify the routing task because more routing tracks is available in the same chip area.

The spacing and width of the wider pitch wires 304.0, 304.2, 304.4, 306.0, 308.0, 308.2, and 308.4 and the narrower pitch wires 302.0-302.5, 306.2-306.4, 308.1, 308.3 and 310.1-310.5 are typically larger than a minimum design width (MD). The minimum device width MD is the smallest device or feature width capable by the manufacturing process used to form the integrated circuit. By way of example, if the minimum design width MD is 0.6 micron, then the smallest devices that can be formed by the manufacturing process have a smallest width of about 0.6 micron. In such a manufacturing process, the second width W2 is equal to or greater than about 0.6 micron and the second separation distance S2 is equal to or greater than about 0.6 micron. By way of example, the second width W2 can be equal to the minimum device width MD and the second separation distance S2 is equal to between about twice and about three times the first separation distance S1. In an exemplary embodiment, the second width W2 is equal to the minimum device width MD and the second separation distance S2 is equal to about 2.8 times the first separation distance S1.

Routing channels 302 and 310 include only narrower pitch wires. Routing channel 304 includes only wider pitch wires. Routing channels 306 and 308 are mixed routing channels as they include a mixture of both wide pitch wires and narrow pitch wires.

Figure 4:
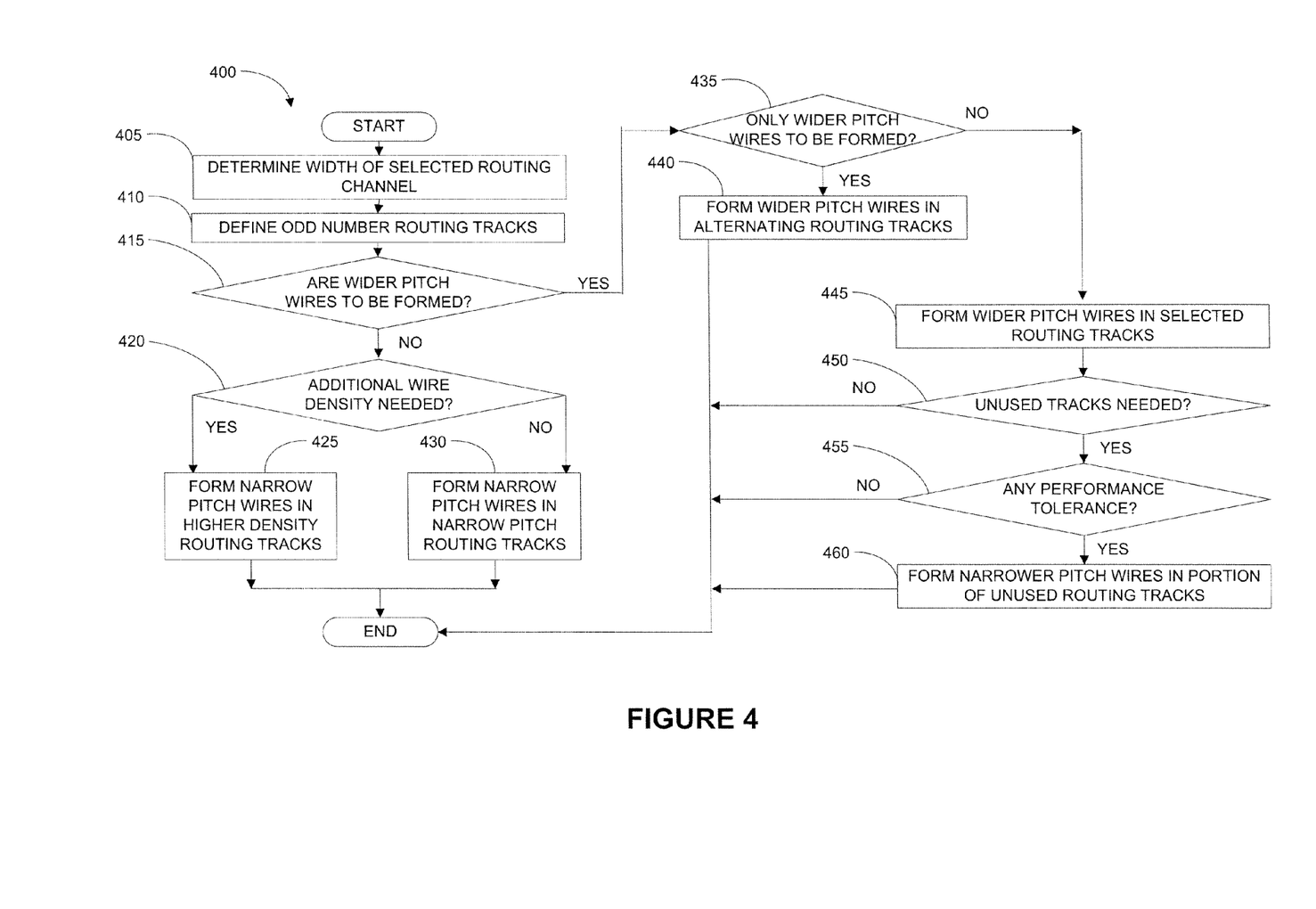
FIG. 4 is a flowchart of the method operations for selecting a grid, in accordance with an embodiment of the present invention.

FIG. 4 is a flowchart of the method operations 400 for selecting a grid, in accordance with an embodiment of the present invention. The method operations 400 describes the method for designing optimized routing tracks in routing channels that include only narrow pitch wires, only wider pitch wires and mixed pitch wires.

In an operation 405 and with reference to FIG. 3A, a width D1 of a routing channel is selected. In one embodiment the D1 is determined by a sum of an even number (n) of initial width routing tracks and spacing of the n initial width routing tracks. Each of the initial width routing tracks has a width W1 about equal to the minimum design width MD allowed by the manufacturing process used to form the integrated circuit. The n initial width routing tracks are separated substantially even separation distance. The separation distance S1 between the n initial width routing tracks is about equal to the minimum design width MD. The n initial width routing tracks and/or the separation distance S1 between the n initial width routing tracks can be greater than the minimum design width MD. The n initial width routing tracks are also separated from the Vss and Vdd grid s by a separation distance S1. Therefore, in at least one embodiment, the width D1 can be determined as follows:

$$D1 = (n \text{ initial width routing tracks})(MD) + (n+1 \text{ separation distances})(MD)$$

and more simplified:

$$D1 = (2n+1)MD$$

In an operation 410, an odd number of substantially evenly spaced routing tracks are defined between the Vdd and Vss grids in a selected routing channel. The odd number can be equal to n−1 or some other odd number of routing tracks as may be desired. As a result, the routing channel width D1 is sufficient to accommodate either even number n initial width routing tracks of the first pitch or an odd number less than n (e.g., less than or equal to n−1) of the narrower pitch routing tracks. In one embodiment, the routing channel width D1 may be increased slightly to accommodate the odd number of the narrower pitch routing tracks. Alternatively, the second spacing distance S2 can be reduced slightly or the second width W2 reduced slightly to accommodate the odd number of the narrower pitch routing tracks in the routing channel. The determination of whether to slightly increase routing channel width D1 or reduce the second spacing distance S2 the second width W2 depends on the specific process technology. By way of example, if the resulting wires are more capacitive than resistive, then to reduce the capacitance the second width W2 reduced slightly so that the second spacing distance S2 can be maximized. Alternatively, if the resulting wires are more resistive than capacitive, then to reduce the resistance the second spacing distance S2 can be reduced slightly so that the second width W2 can be maximized. Alternatively, if there is sufficient space available on the integrated circuit die then the routing channel width D1 can be increased sufficiently to accommodate the odd number of the narrower pitch routing tracks.

In an operation 415, if wider pitch wires are not to be formed, the method operations continue in an operation 420. If wider pitch wires are to be formed, then the method operations continue in operation 435.

In operation 420, if additional routing density is required in the selected routing channel, then the method operations continue in an operation 425. If additional routing density is not required in the selected routing channel, then the method operations continue in an operation 430. A routing requirement defines the amount of signal wires that are needed to traverse an area of the die. As described above, some congested areas may require more signal wires than some other, less congested areas.

In operation 425, narrow wires are formed in each of the n routing tracks to form a higher density narrow pitch routing channel. By way of example routing channel 310 of FIGS. 3A and 3B. This creates one approach to "routing track stealing" to resolve routing congestion. As mentioned above, narrow pitch routing tracks are typically wider than the initial width routing tracks. In some regions of an integrated circuit where routing is highly congested but timing is not an issue, it may be desirable to have additional routing tracks in that region. Therefore, using initial width routing tracks having a pitch smaller than the narrow pitch routing tracks can be helpful. The maximum routing distance using the higher density initial width routing tracks can be limited by performance considerations of noise and timing impacts.

In operation 430, narrow wires are formed in each of the n−1 routing tracks to form a narrow pitch routing channel. By way of example routing channel 302 of FIG. 3. In one embodiment, a narrower spacing distance S4, that is less than second spacing distance S2, can be used to separate signal wires from power wires than between signal wires because power wires Vdd and Vss are quiet signals.

In operation 435, if only wider wires are to be formed then the method operations continue in an operation 440. If wider wires and narrow wires are to be formed in the routing channel, then the method operations continue in an operation 445.

In operation 440, the wider wires and formed in alternating routing tracks to form a wider pitch routing channel. By way of example routing channel 304 of FIG. 3. Using only alternating routing tracks allows three wider pitch tracks to be formed. As a result, a yield of 60% conversion rate from only narrow tracks to only wider tracks is allowed. In contrast, typical conversion rate of prior methods yields approximately only a 50% conversion rate. This has also the advantage of sharing one set of routing grids (i.e. routing channels that all have the same n initial width routing tracks) for both narrow wires and wider wires. This simplifies the set up and reduces the run time for a grid-based routing system.

In operation 445, wider pitch wires are formed in a selected one or more of the routing tracks. If multiple wider wires are formed on the selected one or more routing tracks the multiple wider wires are separated by an unused routing track.

In an operation 450, the unused routing track adjacent to a wider wire is examined to determine if a portion of the unused routing track is needed for routing a narrower pitch wire. By way of example, wires 308.1 and 308.3. If a portion of the unused routing track is needed for routing a narrower pitch wire, then the method operations continue in an operation 455.

In operation 455, the performance of the adjacent wider wires (e.g., wires 308.0, 308.2 and 308.4) are examined to determine if any performance of the wider wires can tolerate a reduction in one or more performance characteristic (e.g., timing performance, noise, resistance, capacitance or other design considerations). Each performance characteristic is compared to the performance characteristic goal defined by the design parameters for the circuit. By way of example, if the wire routing under examination is in a timing critical signal path and has a faster transmission time than timing performance characteristic goal defined by the design parameters for the circuit, then the wire routing under examination exceeds the timing performance characteristic goal and can tolerate being reduced somewhat to not less than the timing performance characteristic goal. If in operation 455, the performance of the adjacent wider wires exceed at least one performance characteristic goal and can therefore tolerate a reduction in performance of that characteristic, then the method operations continue in an operation 460. If the performance of the adjacent wider wires cannot tolerate a reduction in performance, then the method operations continue in an operation 465.

By way of example, if the projected timing performance of wider wires 308.0, 308.2 and 308.4 can tolerate being slowed by 0.1 microsecond and still meet their respective timing performance characteristic goals, then in operation 460, narrower pitch wires 308.1 and 308.3 can be routed in the corresponding unused routing tracks for the length that will reduce the timing performance of the wider wires 308.0, 308.2 and 308.4 less than 0.1 microsecond. It should be understood that length of this routing track "stealing" is limited by the performance impact on the adjacent wires.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Embodiments of the present invention can be processed on a single computer, or using multiple computers or computer components which are interconnected. A computer, as used herein, shall include a standalone computer system having its own processor, its own memory, and its own storage, or a distributed computing system, which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

Figure 5:
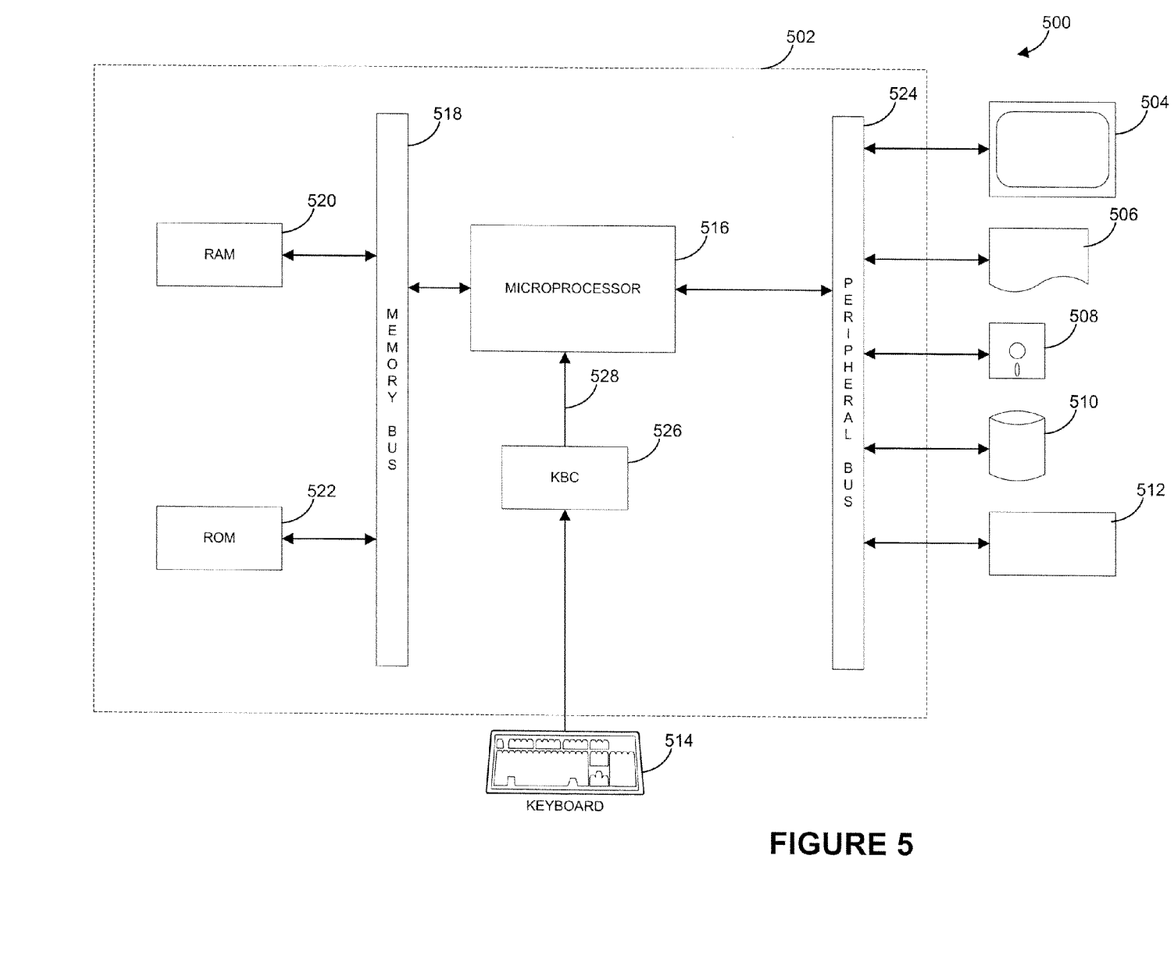
FIG. 5 is a block diagram of an exemplary computer system for carrying out the processing according to an embodiment of the invention.

FIG. 5 is a block diagram of an exemplary computer system 500 for carrying out the processing according to an embodiment of the invention. The computer system 500 includes a digital computer 502, a display screen (or monitor) 504, a printer 506, a floppy disk drive 508, a hard disk drive 510, a network interface 512, and a keyboard 514. The digital computer 502 includes a microprocessor 516, a memory bus 518, a peripheral bus 524, an input/output system including, among other components, a keyboard controller (KBC) 526 and keyboard and related input/output devices (e.g., mouse, trackball, touchpad, biometric input device, etc.). The computer also includes a memory system including a random access memory (RAM) 520, read only memory (ROM) 522. The digital computer 502 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 516 is a general purpose digital processor, which controls the operation of the computer system 500. The microprocessor 516 can be a single-chip processor or can be implemented with multiple components. Using instructions retrieved from memory, the microprocessor 516 controls the reception and manipulation of input data and the output and display of data on output devices.

The memory bus 518 is used by the microprocessor 516 to access the RAM 520 and the ROM 522. The RAM 520 is used by the microprocessor 516 as a general storage area and as scratch-pad memory, and can also be used to store input data and processed data. The ROM 522 can be used to store instructions or program code followed by the microprocessor 516 as well as other data.

The peripheral bus 524 is used to access the input, output, and storage devices used by the digital computer 502. In the described embodiment, these devices include the display screen 504, the printer device 506, the floppy disk drive 508, the hard disk drive 510, and the network interface 512. The keyboard controller 526 is used to receive input from keyboard 514 and send decoded symbols for each pressed key to microprocessor 516 over bus 528.

The display screen 504 is an output device that displays images of data provided by the microprocessor 516 via the peripheral bus 524 or provided by other components in the computer system 500. The printer device 506, when operating as a printer, provides an image on a sheet of paper or a similar surface. Other output devices such as a plotter, typesetter, etc. can be used in place of, or in addition to, the printer device 506.

The floppy disk drive 508 and the hard disk drive 510 can be used to store various types of data. The floppy disk drive 508 facilitates transporting such data to other computer systems, and hard disk drive 510 permits fast access to large amounts of stored data.

The microprocessor 516 together with an operating system operate to execute computer code and produce and use data. The computer code and data may reside on the RAM 520, the ROM 522, or the hard disk drive 510. The computer code and data could also reside on a removable program medium and loaded or installed onto the computer system 500 when needed. Removable program media include, for example, CD-ROM, PC-CARD, floppy disk and magnetic tape.

The network interface 512 is used to send and receive data over a network connected to other computer systems. An interface card or similar device and appropriate software implemented by the microprocessor 516 can be used to connect the computer system 500 to an existing network and transfer data according to standard protocols.

The keyboard 514 is used by a user to input commands and other instructions to the computer system 500. Other types of user input devices can also be used in conjunction with the present invention. For example, pointing devices such as a computer mouse, a track ball, a stylus, or a tablet can be used to manipulate a pointer on a screen of a general-purpose computer.

The invention can also be embodied as computer readable code and/or logic on a computer readable medium. The computer readable medium is any data storage device that can store data which can thereafter be read by a computer system. Examples of the computer readable medium include hard drives, network attached storage (NAS), logic circuits, read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for routing wires in an integrated circuit design comprising:
   using a computer for:
   selecting a first routing channel from a plurality of routing channels in a first conductive layer of a plurality of conductive layers of the integrated circuit, wherein the selected routing channel includes a Vss wire on a first edge and a Vdd wire on an opposite edge; and
   determining a wire routing for the selected routing channel including:
      defining an even number n of initial width routing tracks in a selected routing channel, wherein each of the n initial width routing tracks have a first pitch, wherein the first pitch includes each of the n initial width routing tracks is separated by a substantially equal first separation distance from the other routing tracks, Vss and Vdd in the routing channel, wherein each of the n initial width routing tracks and the substantially equal first separation distance have an initial width about equal to the minimum design width allowed by a manufacturing process used to form the integrated circuit;
      selecting an odd number of routing tracks less than n, wherein the odd number of routing tracks have a second pitch that is greater than the first pitch;
      assigning the odd number of routing tracks in the routing channel;
      analyzing a routing requirement for the routing channel; and
      defining a third routing pitch wider than the second routing pitch for alternating routing tracks of the odd number of routing tracks when the routing channel requires a routing pitch wider than the second pitch.

2. The method of claim 1, wherein the second pitch includes a wire width greater than the minimum design width allowed by a manufacturing process used to form the integrated circuit.

3. The method of claim 1, wherein the second pitch includes a spacing width greater than the minimum design width allowed by a manufacturing process used to form the integrated circuit.

4. The method of claim 1, wherein the third pitch includes a wire width greater than the wire width of the second pitch.

5. The method of claim 1, wherein the third pitch includes a wire width equal to about twice the wire width of the second pitch.

6. The method of claim 1, wherein the third pitch includes a third spacing width greater than the second spacing width.

7. The method of claim 1, wherein the third pitch includes a third spacing width equal to about twice the second spacing width.

8. The method of claim 1, wherein analyzing the routing requirement for the routing channel includes determining the routing channel requires at least one routing track having the third pitch and at least one routing track having the second pitch.

9. The method of claim 8, wherein the at least one routing track having the third pitch and the at least one routing track having the second pitch are separated by an unused routing track having the second pitch.

10. The method of claim 9, wherein at least one of a plurality of performance characteristic of each of the wires in the routing tracks adjacent to the unused routing track exceeds a performance characteristic goal.

11. The method of claim 10, further comprising routing an additional wire in at least a portion of the unused routing track wherein the additional wire reduces the at least one of the plurality of performance characteristic of each of the wires in the routing tracks adjacent to the unused routing track to not less than the performance characteristic goal.

12. The method of claim 1, wherein analyzing the routing requirement for the routing channel includes determining at least one of a plurality of performance characteristic of each of the wires in the routing channel exceeds a performance characteristic goal and wherein defining wires having the first pitch reduces the at least one of the plurality of performance characteristic of each of the wires to not less than the performance characteristic goal.

13. The method of claim 1, further comprising:
   selecting a second routing channel from the plurality of routing channels in the first conductive layer of the integrated circuit; and
   determining a corresponding wire routing for the selected routing channel.

14. The method of claim 13, further comprising:
   selecting a second conductive layer of the integrated circuit; and
   determining a corresponding wire routing for the second conductive layer.

15. A method for routing wires in an integrated circuit design comprising:
   using a computer for:
   selecting a first routing channel from a plurality of routing channels in a first conductive layer of a plurality of conductive layers of the integrated circuit, wherein the selected routing channel includes a Vss wire on a first edge and a Vdd wire on an opposite edge;

determining a wire routing for the selected routing channel including:

defining an even number n of initial width routing tracks in a selected routing channel, wherein each of the n initial width routing tracks have a first pitch, wherein the first pitch includes each of the n initial width routing tracks is separated by a substantially equal first separation distance from the other routing tracks, Vss and Vdd in the routing channel, wherein each of the n initial width routing tracks and the substantially equal first separation distance have an initial width about equal to the minimum design width allowed by a manufacturing process used to form the integrated circuit;

selecting an odd number of routing tracks less than n, wherein the odd number of routing tracks have a second pitch that is greater than the first pitch;

assigning the odd number of routing tracks in the routing channel;

analyzing a routing requirement for the routing channel; and defining a third routing pitch wider than the second routing pitch for alternating routing tracks of the odd number of routing tracks when the routing channel requires a routing pitch wider than the second pitch and wherein analyzing the routing requirement for the routing channel includes determining the routing channel requires a plurality of routing tracks having the third pitch;

selecting a second routing channel from the plurality of routing channels in a first conductive layer;

determining a second wire routing for the second routing channel wherein the second wire routing includes a plurality of routing tracks having the second pitch;

selecting a third routing channel from the plurality of routing channels in a first conductive layer;

determining a third wire routing for the third routing channel wherein the third wire routing includes at least one routing track having the third pitch and the at least one routing track having the second pitch are separated by an unused routing track having the second pitch, wherein at least one of a plurality of performance characteristic of each of the wires in the routing tracks adjacent to the unused routing track exceeds a performance characteristic goal; and routing an additional wire in at least a portion of the unused routing track in the third routing channel wherein the additional wire reduces the at least one of the plurality of performance characteristic of each of the wires in the routing tracks adjacent to the unused routing track to not less than the performance characteristic goal.

16. A system for defining a wire routing in an integrated circuit design comprising:

a processor;
a memory system;
an input/output system;

logic for selecting a first routing channel from a plurality of routing channels in a first conductive layer of a plurality of conductive layers of the integrated circuit, wherein the selected routing channel includes a Vss wire on a first edge and a Vdd wire on an opposite edge;

logic for determining a wire routing for the selected routing channel including:

logic for defining an even number n of initial width routing tracks in a selected routing channel, wherein each of the n initial width routing tracks have a first pitch, wherein the first pitch includes each of the n initial width routing tracks is separated by a substantially equal first separation distance from the other routing tracks, Vss and Vdd in the routing channel, wherein each of the n initial width routing tracks and the substantially equal first separation distance have an initial width about equal to the minimum design width allowed by a manufacturing process used to form the integrated circuit;

logic for selecting an odd number of routing tracks less than n, wherein the odd number of routing tracks have a second pitch that is greater than the first pitch;

logic for assigning the odd number of routing tracks in the routing channel;

logic for analyzing a routing requirement for the routing channel; and logic for defining a third routing pitch wider than the second routing pitch for alternating routing tracks of the odd number of routing tracks when the routing channel requires a routing pitch wider than the second pitch.

17. The system of claim 16, wherein the logic for analyzing the routing requirement for the routing channel includes logic for determining the routing channel requires at least one routing track having the third pitch and at least one routing track having the second pitch.

18. The system of claim 17, wherein the at least one routing track having the third pitch and the at least one routing track having the second pitch are separated by an unused routing track having the second pitch and wherein at least one of a plurality of performance characteristic of each of the wires in the routing tracks adjacent to the unused routing track exceeds a performance characteristic goal and further comprising logic for routing an additional wire in at least a portion of the unused routing track wherein the additional wire reduces the at least one of the plurality of performance characteristic of each of the wires in the routing tracks adjacent to the unused routing track to not less than the performance characteristic goal.

19. The system of claim 16, wherein the logic for analyzing the routing requirement for the routing channel includes logic for determining at least one of a plurality of performance characteristic of each of the wires in the routing channel exceeds a performance characteristic goal and wherein defining wires having the first pitch reduces the at least one of the plurality of performance characteristic of each of the wires to not less than the performance characteristic goal.

* * * * *